(12) United States Patent
Bulovic et al.

(10) Patent No.: US 9,728,735 B2
(45) Date of Patent: Aug. 8, 2017

(54) TRANSPARENT PHOTOVOLTAIC CELLS

(75) Inventors: Vladimir Bulovic, Lexington, MA (US); Richard Royal Lunt, Okemos, MI (US)

(73) Assignee: MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 0 days.

(21) Appl. No.: 13/358,075

(22) Filed: Jan. 25, 2012

(65) Prior Publication Data

US 2012/0186623 A1    Jul. 26, 2012

Related U.S. Application Data

(60) Provisional application No. 61/436,371, filed on Jan. 26, 2011.

(51) Int. Cl.
*H01L 51/42* (2006.01)
*H01L 27/30* (2006.01)
*H01L 51/44* (2006.01)

(52) U.S. Cl.
CPC ........ *H01L 51/4213* (2013.01); *H01L 27/302* (2013.01); *H01L 51/4246* (2013.01); *H01L 51/4253* (2013.01); *H01L 51/442* (2013.01); *H01L 51/447* (2013.01); *Y02E 10/549* (2013.01)

(58) Field of Classification Search
CPC .......................... H01L 51/102; H01L 51/0583
USPC ......................................................... 136/263
See application file for complete search history.

(56) References Cited

U.S. PATENT DOCUMENTS

| 5,176,758 | A  | * | 1/1993 | Nath et al. ................... 136/251 |
| 6,580,027 | B2 | * | 6/2003 | Forrest et al. ................ 136/263 |
| 2005/0155641 | A1 | * | 7/2005 | Fafard .......................... 136/249 |
| 2006/0027834 | A1 |   | 2/2006 | Forrest et al. |
| 2006/0032529 | A1 | * | 2/2006 | Rand et al. ................... 136/263 |
| 2007/0063156 | A1 | * | 3/2007 | Hayashi .................. 250/559.07 |
| 2010/0084011 | A1 | * | 4/2010 | Forrest et al. ................ 136/255 |

(Continued)

FOREIGN PATENT DOCUMENTS

| CN | 101044640 A | 9/2007 |
| JP | 05-259495 | 10/1993 |

(Continued)

OTHER PUBLICATIONS

Chauhan et al, Efficient Organic Photovoltaic Cells through Structural Modification of Chloroaluminum Phthalocyanine/Fullerne Heterojunctions, Feb. 2, 2010, American Chemical Society, 114, 3304-3308.*

(Continued)

*Primary Examiner* — Bethany L Martin
(74) *Attorney, Agent, or Firm* — Kilpatrick Townsend & Stockton LLP

(57) ABSTRACT

A transparent photovoltaic cell and method of making are disclosed. The photovoltaic cell may include a transparent substrate and a first active material overlying the substrate. The first active material may have a first absorption peak at a wavelength greater than about 650 nanometers. A second active material is disposed overlying the substrate, the second active material having a second absorption peak at a wavelength outside of the visible light spectrum. The photovoltaic cell may also include a transparent cathode and a transparent anode.

32 Claims, 15 Drawing Sheets

(56) References Cited

U.S. PATENT DOCUMENTS

| | | | |
|---|---|---|---|
| 2010/0301320 A1* | 12/2010 | Rand | B82Y 10/00 257/40 |
| 2011/0030771 A1 | 2/2011 | Forrest et al. | |
| 2011/0132453 A1* | 6/2011 | Uetani | B82Y 10/00 136/256 |
| 2011/0272030 A1* | 11/2011 | Kitazawa | C08G 61/122 136/263 |
| 2012/0090685 A1 | 4/2012 | Forrest et al. | |

FOREIGN PATENT DOCUMENTS

| | | | | |
|---|---|---|---|---|
| JP | 2006237165 A | 9/2006 | | |
| JP | 2008509559 A | 3/2008 | | |
| JP | 2009-060051 | 3/2009 | | |
| JP | 2010-041040 | 2/2010 | | |
| JP | WO2010084865 | * | 7/2010 | H01L 51/42 |
| JP | 2010541211 A | 12/2010 | | |
| WO | WO2010024157 | * | 3/2010 | B82Y 10/00 |
| WO | 2010036963 A1 | 4/2010 | | |

OTHER PUBLICATIONS

Chi-Feng Lin et al.: "High Photoelectric Conversion Efficiency of Metal Phthalocyanine/Fullerene Heterojunction Photovoltaic Device", Int. J. Mol. Sci., vol. 12, Jan. 17, 2011 (Jan. 17, 2011), pp. 476-505.

Ning Li and Stephen R. Forrest: Tilted bulk heterojunction organic photovoltaic cells grown by oblique angle deposition, Applied Physics Letters, AIP, American Institute of Physics, Melville, NY, US, vol. 95, No. 12, Sep. 25, 2009 (Sep. 25, 2009), pp. 123309-1-123309-3.

Schmidt et al.: "Efficient semitransparent inverted organic solar cells with indium tin oxide top electrode", Applied Physics Letters, AIP, American Institute of Physics, Melville, NY, US, vol. 94, No. 24, Jun. 15, 2009 (Jun. 15, 2009), pp. 243302-1-243302-3.

Richard R Lunt and Vladimir Bulovic: "Transparent, near-infrared organic photovoltaic solar cells for window and energy-scavenging applications", Applied Physics Letters, AIP, American Institute of Physics, Melville, NY, US, vol. 98, No. 11, Mar. 14, 2011 (Mar. 14, 2011), pp. 113305-1-113305-3.

Qingfeng Dong et al., "All-spin-coating vacuum-free processed semi-transparent inverted polymer solar cells with PEDOT:PSS anode and PAH-D interfacial layer", Organic Electronics 11, (Apr. 2010) 1327-1331.

Jan Meiss et al., "Efficient semitransparent small-molecule organic solar cells", Applied Physics Letters 95, (Nov. 2009).

Rhonda F. Bailey-Salzman et al., "Semitransparent organic photovoltaic cells", Applied Physics Letters 88, (Jun. 2006).

Robert Koeppe et al., "Organic Solar Cells with Semitransparent Metal Back Contacts for Power Window Applications", ChemSusChem (2009), 2, 309-313.

H. Schmidt et al., "Efficient semitransparent inverted organic solar cells with indium tin oxide top electrode", Applied Physics Letters 94, (Jun. 2009).

P. Fath et al., "Industrial manufacturing of semitransparent crystalline silicon Power solar cells", Solar Energy Materials & Solar Cells 74 (2002) 127-131.

Yinhua Zhou et al., "Indium tin oxide-free and metal-free semitransparent organic solar cells", Applied Physics Letters 97, (Oct. 2010).

Ralph Kuhn et al., "Characterization of Novel Mono- and Bifacially Active Semi-Transparent Crystalline Silicon Solar Cells", IEEE Transactions on Electron Devices, vol. 46, No. 10, (Oct. 1999).

J. Hanisch et al., "Contacts for semitransparent organic solar cells", Eur.Phys.J.Appl.Phys. 37,261-264 (2007).

S. Tanaka et al., "Semitransparent organic photovoltaic cell with carbon nanotube-sheet anodes and Ga-doped ZnO cathodes", Synthetic Metals 159 (Sep. 2009) 2326-2328.

Ning Li et al., "Open circuit voltage enhancement due to reduced dark current in small molecule photovoltaic cells", Applied Physics Letters 94, (Jan. 2009).

Rhonda F. Bailey-Salzman et al., "Near-infrared sensitive small molecule organic photovoltaic cells based on chloroaluminum phthalocyanine", Applied Physics Letters 91, (Jul. 2007).

Jan Meiss et al., "Ito-Free, Semitransparent Small-Molecule Organic Solar Cells With Dibenzoperiflanthene as Absorber", 25th European Photovoltaic Solar Energy Conference and Exhibition / 5th World Conference on Photovoltaic Energy Conversion, 6-10 (Sep. 2010).

Xiaomin Tu et al., "DNA sequence motifs for structure-specific recognition and separation of carbon nanotubes",Nature vol. 460, (Jul. 2009).

Gang Fu et al., "Resonant Third-Order Optical Nonlinearities of Silicon 2,3-Naphthalocyanine Dioctyloxide Measured by Femtosecond Degenerate Four-Wave Mixing Technique", Japanese Journal of Applied Physics vol. 44, No. 6A, (2005), pp. 4006-4008.

K.P. Unnikrishnan et al., "Second hyperpolarizability of certain phthalocyanines and naphthalocyanines", Synthetic Metals 139 (2003) 371-375.

Had Singh Nalwa et al., "Large Third-order Optical Non-linearities of Spin-cast Thin Films of Novel Metallo-naphthalocyanines", Journal of Porphyrins and Phthalocyanines. vol. 2, 21-30 (1998).

Leif A. A. Pettersson et al. Modeling photocurrent action spectra of photovoltaic devices based on organic thin films: Journal of Applied Physics, Jul. 1, 1999, vol. 86, No. 1, p. 487-496.

Peter Peumans et al. Small molecular weight organic thin-film photodetectors and solar cells: Journal of Applied Physics, Apr. 1, 2003, vol. 93, No. 7, p. 3693-3723.

Matt Law et al. Determining the Internal Quantum Efficiency of PbSe Nanocrystal Solar Cells with the Aid of an Optical Model: Nano Letters, 2008, vol. 8, No. 11, p. 3904-3910.

CN201280009604.1, "Office Action", Nov. 18, 2016, 11 pages.
JP2013-551309, "Office Action", Oct. 25, 2016, 12 pages.

* cited by examiner

TRANSPARENT PHOTOVOLTAIC CELLS

CROSS-REFERENCE TO PRIOR FILED APPLICATION

This application claims priority to earlier filed provisional application 61/436,671 filed on Jan. 26, 2011, which is herein incorporated by reference in its entirety.

FIELD OF INVENTION

This invention relates to the field of photovoltaic devices and more particularly, organic photovoltaic devices.

BACKGROUND

The surface area necessary to take advantage of solar energy remains an obstacle to offsetting a significant portion of non-renewable energy consumption. For this reason, low-cost, transparent, organic photovoltaic (OPV) devices that can be integrated onto window panes in homes, skyscrapers, and automobiles are desirable. For example, window glass utilized in automobiles and architecture are typically 70-80% and 55-90% transmissive, respectively, to the visible spectrum, e.g., light with wavelengths from about 450 to 650 nanometers (nm). The limited mechanical flexibility, high module cost and, more importantly, the band-like absorption of inorganic semiconductors limit their potential utility to transparent solar cells. In contrast, the excitonic character of organic and molecular semiconductors results in absorption spectra that are highly structured with absorption minima and maxima that is uniquely distinct from the band-absorption of their inorganic counterparts. Previous efforts to construct semitransparent devices have focused on the use of thin active layers (or physical holes) with absorption focused in the visible spectrum and therefore have been limited to either low efficiencies <1% or low average visible transmissivity (AVT) to light around 10-35%, since both parameters cannot be simultaneously optimized.

SUMMARY OF THE INVENTION

A transparent photovoltaic cell and method of making are disclosed. The photovoltaic cell may include a transparent substrate and a first active material overlying the substrate. The first active material may have an absorption peak at a wavelength greater than about 650 nanometers. A second active material is disposed overlying the substrate, the second active material having an absorption peak at a wavelength outside of the visible light spectrum. The photovoltaic cell may also include a transparent cathode and a transparent anode.

At least one of the cathode and the anode may be configured to maximize absorption in the first active material. At least one of the cathode and the anode may be configured to maximize absorption in the second active material. The first active material and the second active material may be located in separate layers. The first active material may have a second absorption peak at a wavelength less than about 450 nanometers.

The first active material may be a donor and the second active material may be an acceptor. The device may also include a mirror reflecting at near infra-red wavelengths. The first active material may comprise an organic material. The first active material may comprise at least one of: a phthalocyanine, a porphyrin, or a naphthalocyanine dye. The first active material may comprise chloroaluminum phthalocyanine. The first active layer may comprise tin phthalocyanine. The second active layer may comprise at least one of carbon 60 ($C_{60}$) or a nanotube. The first and second active materials may be configured for use with flexible encapsulation layers.

The photovoltaic cell may include a transparent substrate and a first active material overlying the substrate. The first active material may have a first absorption peak at wavelengths greater than about 650 nanometers. The photovoltaic cell may include a second active material overlying the substrate, the second active material having a second absorption peak at a wavelength greater than about 650 nanometers or less than about 450 nanometers. The photovoltaic cell may also include a transparent cathode and a transparent anode.

The photovoltaic cell may include a recombination zone disposed between a first and second subcell, each of the first and second subcells having absorption peaks at wavelengths outside of the visible light spectrum, a transparent cathode and a transparent anode. The photovoltaic cell may be transparent or semi-transparent.

A method of fabricating a photovoltaic cell may include fabricating a first electrode material on a substrate, the electrode material and the substrate being transparent to visible light. At least one layer may be fabricated, the layer having a first active material with an absorption peak at a wavelength greater than about 650 nanometers and a second active material with an absorption peak at a wavelength outside of the visible light spectrum. A second electrode may be fabricated of material transparent to visible light. The method may include selecting a thickness of at least one of the first or second electrodes such that absorption of near infrared light in the infrared-absorbing active layer is maximized. The method may also include fabricating a multilayer mirror for near-infrared light.

The method may include fabricating a first and second subcell, each of the first and second subcells having absorption peaks at wavelengths outside of the visible light spectrum. A recombination zone may be disposed between the first and second subcell. A transparent cathode and a transparent anode may also be fabricated. The photovoltaic cell may be transparent or semi-transparent.

DETAILED DESCRIPTION OF THE INVENTION

Figure 1:
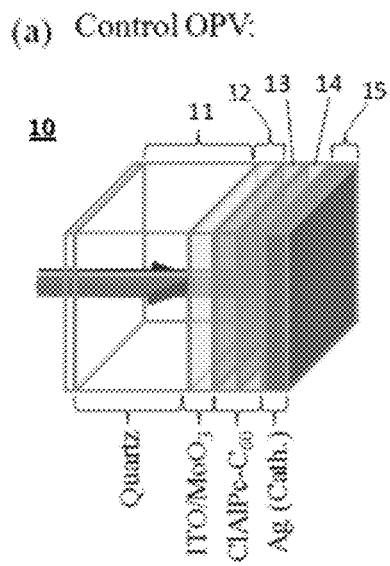
FIG. 1(a) shows a schematic of a control solar cell.
FIG. 1(b) shows a schematic of a full transparent solar cell embodiment.
FIG. 1(c) is a graph showing the extinction coefficient, k, of the active layers shown in FIGS. 1(a) and 1(b)
FIG. 1(d) is a graph showing the current-voltage (J-V) curves for the ClAlPc-$C_{60}$ control and transparent cells shown in FIGS. 1(a) and 1(b)
Figure 1:
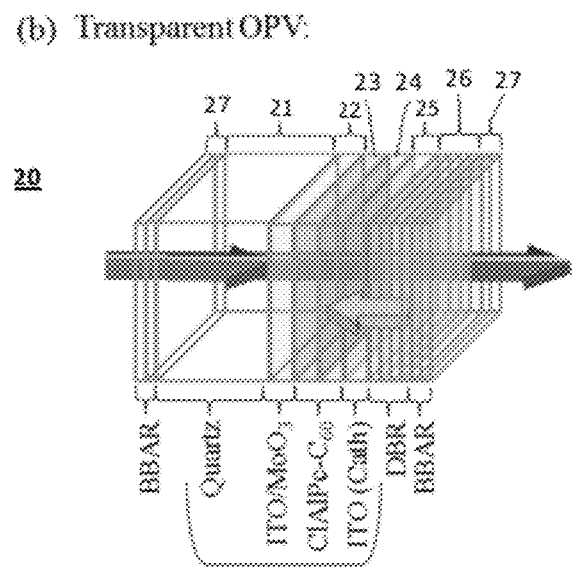
Figure 1:
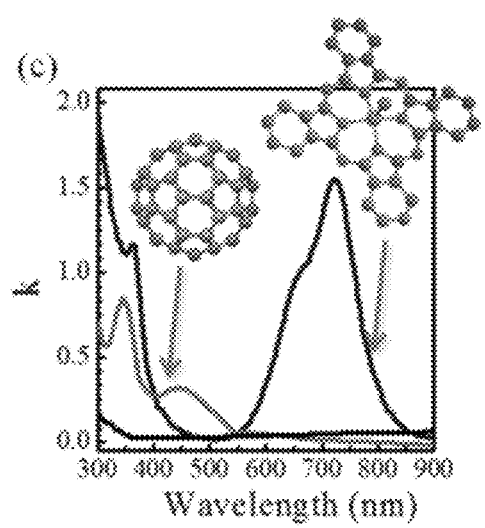
Figure 1:
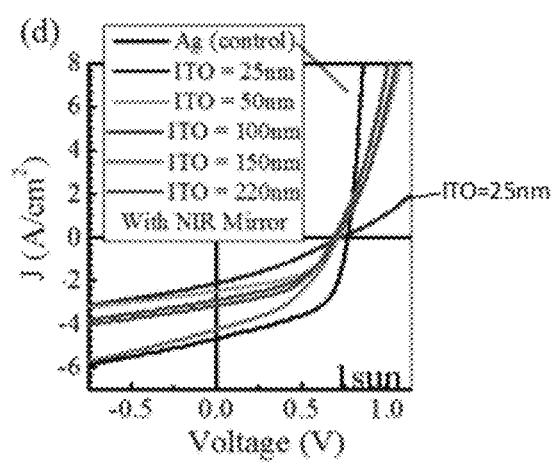

Described herein are improved transparent solar cell designs, e.g., transparent organic photovoltaic devices (TOPV). The term transparent as used herein encompasses an average visible transparency of a straight through beam of 45% or more. The term semi-transparent as used herein encompasses an average visible transparency of a straight through beam of approximately 10%-45%. In general, the designs include molecular active layers with strong absorption features outside of the visible light spectrum, e.g., in the ultra-violet (UV) and/or near-infrared (NIR) solar spectrum. The devices may include selective high-reflectivity NIR and broadband anti-reflection contact coatings. Devices may be formed as heterojunction solar cells with an organic active layer, such as chloroaluminum phthalocyanine (ClAlPc) or SnPc as a donor and a molecular active layer such as $C_{60}$ acting as an acceptor and having peak-absorption in the UV and NIR solar spectrum. Other suitable materials for the active layers include any suitable phthalocyanine, porphyrin, naphthalocynanine dye, carbon nanotubes or molecular excitonic materials with absorption peaks outside the visible spectrum. Such devices may be formed in a tandem structure with one or more subcells joined via a recombination zone. Such devices may be used in a variety of applications including rigid and flexible computer display screens used in a desktop monitor, laptop or notebook computer, tablet computer, mobile phone, e-readers and the like. Other applications include watch crystals, automotive and architectural glass including sunroofs and privacy glass. The photovoltaic devices may be used for active power generation, e.g., for completely self-powered applications, and battery charging (or battery life extension).

Near-infrared (NIR) as recited herein is defined as light having wavelengths in the range from about 650 to about 850 nanometers (nm). Ultraviolet (UV) as recited herein is defined as light having wavelengths less than about 450 nm. The use of an active layer having absorption in the NIR and the UV allows for the use of selective high-reflectivity near-infrared mirror coatings to optimize device performance while also permitting high transmission of visible light through the entire device. Visible light as recited herein is defined as light having wavelengths to which the human eye has a significant response, from about 450 to about 650 nm.

In one embodiment, devices were fabricated on 150 nm of patterned Indium Tin Oxide (ITO) (15 Ω/sq.) pre-coated onto glass substrates. The ITO is one component of an electrode. The ITO was solvent-cleaned and subsequently treated in oxygen plasma for 30 seconds immediately prior to loading into a high vacuum chamber ($<1\times10^{-6}$ Torr). ClAlPc and $C_{60}$ were purified once by vacuum train sublimation prior to loading. Bathocuproine (BCP) and molybdenum trioxide ($MoO_3$) were used as purchased. $MoO_3$ is another component of an electrode. The $MoO_3$ (20 nm), ClAlPc (15 nm), $C_{60}$ (30 nm), BCP (7.5 nm), and a 100 nm thick Ag cathode were sequentially deposited via thermal evaporation at a rate of 0.1 nm/s. The top ITO cathode for the transparent devices was rf-sputtered directly onto the organic layers at low power (7-25 W) with 10 sccm Ar flow (6 mTorr) and 0.005-0.03 nm/second. Cathodes were evaporated through a shadow mask, defining a 1 millimeter (mm)×1.2 mm active device area. A near-infrared distributed Bragg reflector (DBR) utilized as the transparent NIR mirror was grown separately on quartz via sputtering of 7 alternating layers of $TiO_2$ and $SiO_2$ at about 0.1 nm/second with thicknesses centered around a wavelength of 800 nm (200 nm stop band). Broad-band antireflection (BBAR) coatings precoated on quartz substrates (1-side) were attached to the DBRs via index matching fluid to reduce additional glass/air interface reflections. Transmission data of the assembled devices were obtained at normal incidence with a Cary Eclipse 5000 dual-beam spectrophotometer without reference samples. Current density versus voltage (J-V) characteristics were measured in the dark and under simulated AM1.5G solar illumination without solar mismatch correction (for reference, the mismatch factor was estimated to be ~1.05) and external quantum efficiency (EQE) measurements were collected utilizing an NREL calibrated Si detector. Optical interference modeling was carried out according to the method of L. A. A. Pettersson, L. S. Roman, and O. Inganas, Journal of Applied Physics 86, 487 (1999), the contents of which are herein incorporated by reference. The exciton diffusion lengths of ClAlPc and $C_{60}$ were estimated from fitting the magnitudes of the photocurrent and EQE to be 5±3 nm and 10±5 nm, respectively.

FIG. 1(a) shows a schematic of a control solar cell 10. The control solar cell includes a substrate 11, an anode 12, a donor layer 13 e.g., ClAlPc, a molecular active layer, e.g., $C_{60}$, acting as an acceptor layer 14 and a cathode 15. In this example, the anode 15 is opaque, e.g., silver. FIG. 1(b) shows a schematic of a full transparent solar cell 20. The device 20 generally includes a transparent substrate 21, an anode 22, a donor layer 23, e.g., ClAlPc, a molecular active layer, e.g., $C_{60}$, acting as an acceptor layer 24, and a cathode 25. The donor layer 23 and the acceptor layer 24 have absorption peaks in the ultra-violet (UV) and near-infrared (NIR) spectrum. In this example, the substrate is quartz. It should be understood that a variety of rigid and flexible substrates may be used. For example, the substrate may be glass, a rigid or flexible polymer, e.g., a screen protector or skin, or may be combined with other layers such as encapsulating layers, anti-reflecting layers or the like. In this example, the transparent anode 22 and cathode 25 are formed of conducting oxide, e.g. ITO/$MoO_3$. It should be understood that the anode 22 and cathode 25 may be formed of other materials such as tin oxides, fluorinated tin oxides, nanotubes, Poly(3,4-ethylenedioxythiophene) (PDOT) or PEDOT:PSS (Poly(3,4-ethylenedioxythiophene)poly(styrenesulfonate)), gallium doped zinc oxide, aluminum doped zinc oxide and other materials having suitable transparency and conductivity. The device 20 may also include a near-infrared DBR 26 and one or more broad-band antireflection (BBAR) coatings 27.

FIG. 1(c) is a graph showing the extinction coefficient, k, of the active layers shown in FIGS. 1(a) and 1(b). FIG. 1(d) is a graph showing the current-voltage (J-V) curves for the ClAlPc-$C_{60}$ control and transparent cells of FIGS. 1(a) and 1(b) for a range of thicknesses of ITO. The absorption peak for ClAlPc is positioned in the NIR range (~740 nm). This allows for the incorporation of a NIR reflecting mirror and simultaneous optimization of the solar cell performance and visible-transmissivity as diagramed in FIGS. 1(a) and 1(b). It should be understood that the donor and/or acceptor layers may have one or more absorption peaks outside of the visual spectrum. In this example, the ClAlPc also has a second absorption peak in the UV range. A summary of various device performances is provided in Table 1.

TABLE 1

| Cathode Thickness (nm) | Cathode Composition | Jsc (mA/cm²) | Voc (V) | FF | $\eta_P$ (%) | AVT (%) |
|---|---|---|---|---|---|---|
| 100 | Ag | 4.7 | 0.77 | 0.55 | 2.4 | 0 |
| 20 | ITO | 1.5 | 0.69 | 0.39 | 0.5 | 67 |
| 120 | ITO | 3.2 | 0.71 | 0.46 | 1.3 | 65 |
| 20 | ITO/NIR mir. | 2.2 | 0.73 | 0.32 | 0.6 | 53 |
| 40 | ITO/NIR mir. | 2.5 | 0.71 | 0.49 | 1.1 | 55 |
| 80 | ITO/NIR mir. | 2.9 | 0.71 | 0.46 | 1.2 | 56 |
| 120 | ITO/NIR mir. | 4.4 | 0.71 | 0.44 | 1.7 | 56 |
| 170 | ITO/NIR mir. | 3.2 | 0.69 | 0.48 | 1.3 | 66 |

Table 1 generally includes data showing the performance of control OPVs with an Ag cathode, transparent OPVs with ITO cathode, and OPVs with ITO cathode and NIR mirror, at 0.8 sun illumination corrected for solar spectrum mismatch. Short circuit current, JSC, open circuit voltage, VOC, fill factor, FF, power conversion efficiency, $\eta_P$, and the average visible transmission, AVT, are indicated. The control device with a thick Ag cathode exhibits a power conversion efficiency ($\eta_p$) of 1.9±0.2%, open circuit voltage (Voc)=0.80±0.02V, short-circuit current density (Jsc)=4.7± 0.3 mA/cm², and fill-factor (FF)=0.55±0.03, which is comparable to previous reports.

Figure 2:
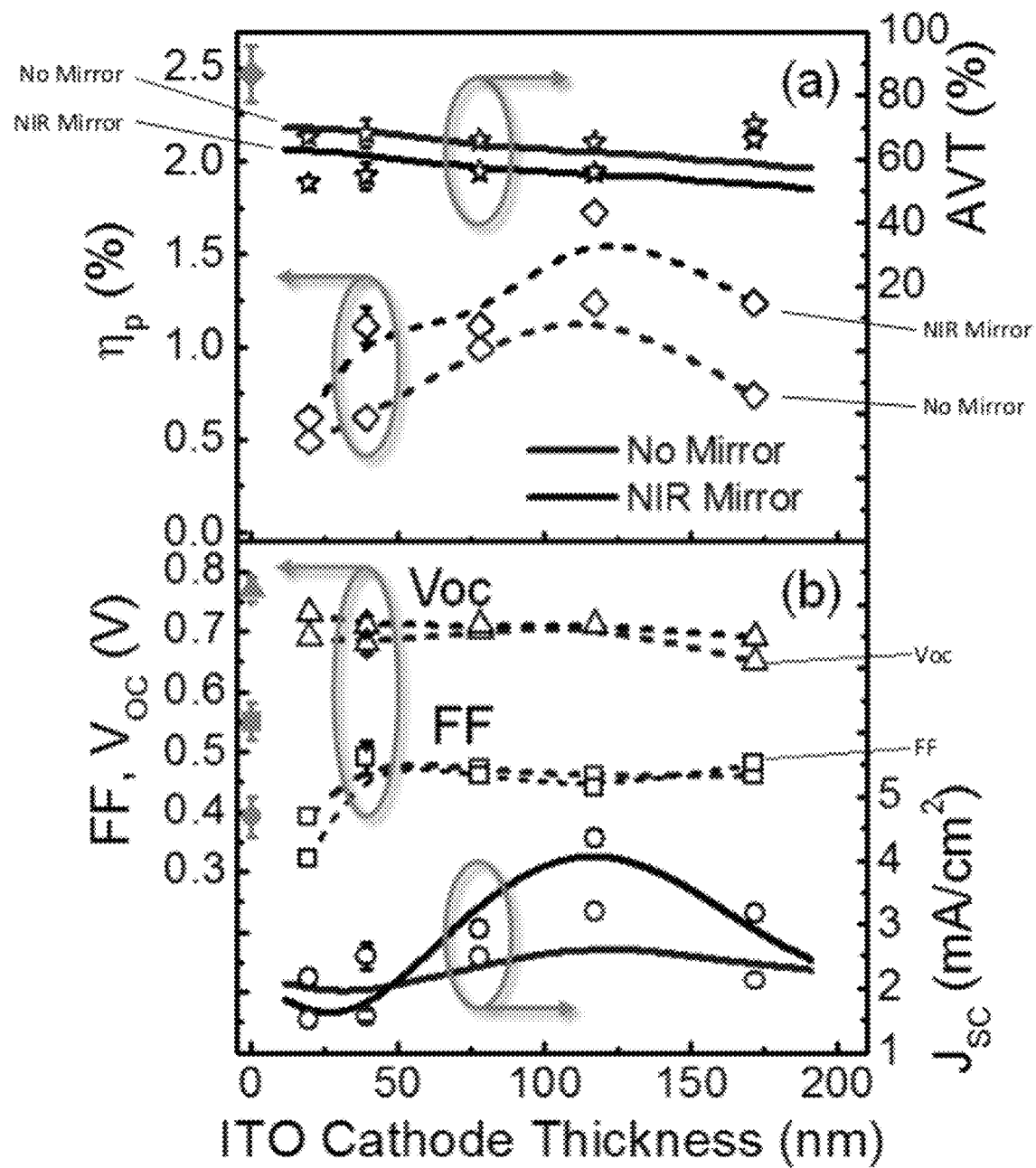
FIG. 2(a) is a graph showing the series resistance diminish and the fill factor (FF) saturates close to the value for the control cell as Indium Tin Oxide (ITO) thickness is increased.
FIG. 2(b) is a graph showing photocurrent increase by a factor of 3× at an optimum thickness of 120 nm so that $\eta_p$ increases by nearly the same amount.

When the Ag cathode of the control cell is replaced with ITO, the short-circuit current Jsc drops significantly to 1.5±0.1 mA/cm², the FF drops to 0.35±0.02, and the open-circuit voltage Voc decreases slightly to 0.7±0.02V leading to $\eta_p$=0.4±0.1%. The FF decreases due to an increase in series resistance from the thin ITO that is observable in the J-V curve under forward bias in FIG. 1(c). FIG. 2(a) is a graph showing the series resistance diminish and the FF saturate close to the value for the control cell as ITO thickness is increased. In FIGS. 2(a) and 2(b), the solid lines are from actual simulations, the dashed lines are simply guides to the eye. The slight drop in Voc, independent of ITO thickness, is likely due to a slight reduction in the cathode-anode work function offset. Nonetheless it is remarkable that when utilizing ITO as both anode and cathode there is enough deposition anisotropy in the work function to support this large Voc and is likely assisted by the large work function $MoO_3$ layer.

Figure 3:
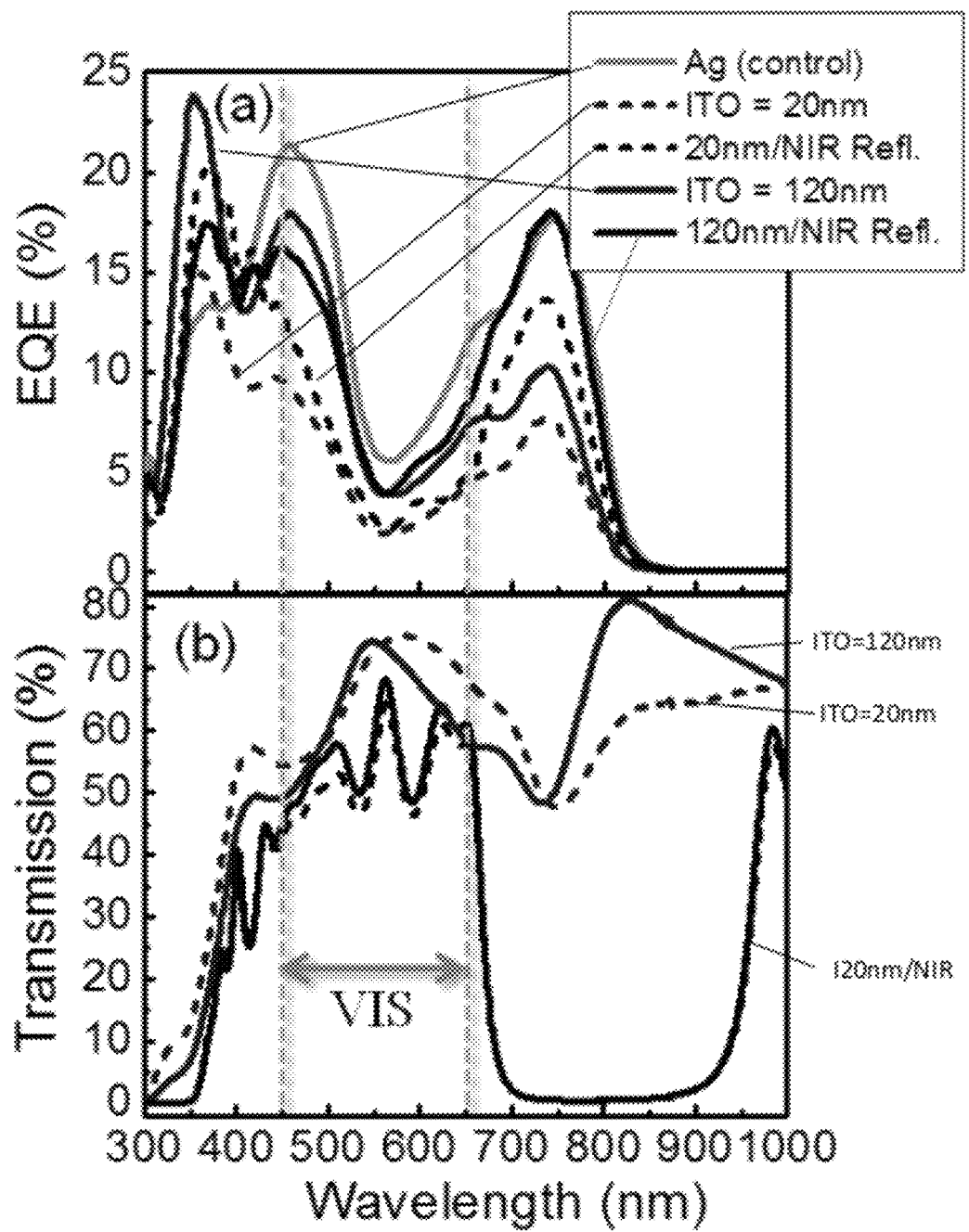
FIG. 3(a) is a graph showing external quantum efficiency (EQE) as a function of wavelength for several thicknesses of ITO and control layers.
FIG. 3(b) is a graph showing transmission % as a function of wavelength for several thicknesses of ITO and control layers.
FIG. 3(c) shows the measured solar simulator spectrum exhibiting characteristics of the Xe-lamp and NREL reported mc-Si external quantum efficiency (EQE) for the reference-diode used to measure the solar simulator intensity.
FIG. 3(d) shows the measured and calculated reflectivity of the distributed Bragg reflector used in this study as the transparent, NIR mirror.
Figure 3:
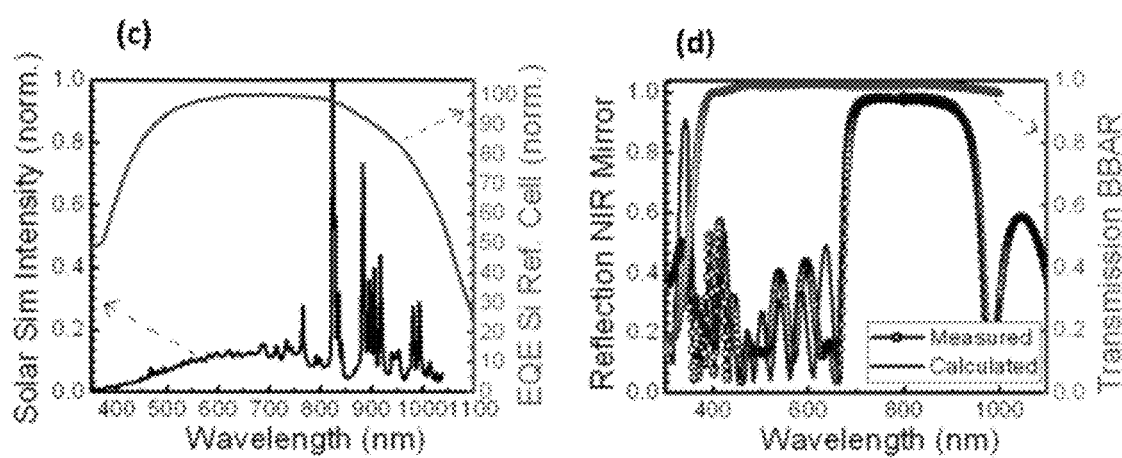

The Jsc decreases as the cathode is switched from Ag to ITO due to reduced cathode reflections that reduce the total absorption across the spectrum in the active layers. FIG. 2(b) is a graph showing photocurrent increase by a factor of 3× at an optimum thickness of 120 nm so that $\eta_p$ increases by nearly the same amount. Fitting this data with the optical interference model shows that this behavior stems from interference of the backside ITO cathode reflection. FIG. 3(a) is a graph showing EQE as a function of wavelength for several thicknesses of ITO and control layers with and without NIR reflecting mirrors. The approximate visible photopic range is highlighted by vertical dashed lines. FIG. 3(b) is a graph showing transmission % as a function of wavelength for several thicknesses of ITO and control layers. Comparing EQE and transmission of the ITO-only devices, the absorption for the thinnest and optimized thicknesses appears equivalent. Inspection of the simulations shows, however, that the NIR field distribution is shifted from within the ITO anode to the ClAlPc active layer as the ITO cathode thickness increases, so that the total transmission appears the same even though the active layer absorption changes substantially. This highlights an important aspect of transparent OPV architectures; despite the seemingly simple optical configuration, interference management is still crucial to device optimization, particularly for NIR absorbing cells and for materials with low exciton diffusion lengths.

Despite the significant impact on the photocurrent, the average visible transmissivity (AVT) shows little variation with ITO thickness (see e.g., FIG. 2(a)). The optical model predicts a slight decrease in AVT with ITO thicknesses that is not observed experimentally possibly due to model parameter uncertainties or varying optical constants during thicker ITO growths. Optimized cells without the NIR mirror show min (max) transmission values of 50% (74%) at 450 nm (540 nm) and an AVT of 65% (standard deviation of 7%). These transmission values decrease slightly with the incorporation of the NIR reflector to min (max) transmission values of 47% (68%) at 450 nm (560 nm) and an AVT of 56% (standard deviation of 5%), where this reduction results from increased off-resonance visible reflections of the mirror. It is possible to remove the off-resonance reflection oscillations in the visible spectra by designing more complex hot-mirror architectures to improve the AVT closer to that of the cell without the NIR mirror, but this typically requires a greater number layers. Hot mirror architectures are described in A. Thelen, Thin Films for Optical Systems 1782, 2 (1993), which is hereby incorporated by reference. High reflectivity of 99% between 695-910 nm also makes these devices useful for simultaneous NIR rejection in architectural cooling. Additionally, the use of the BBAR coatings next to the DBR (outcoupling) and below the substrates (incoupling), results in a concomitant increase in the quantum efficiency by ~2-3% and the AVT by ~4-6%.

FIG. 3(c) shows the measured solar simulator spectrum (left axis) exhibiting characteristics of the Xe-lamp and NREL reported mc-Si external quantum efficiency (EQE) for the reference-diode used to measure the solar simulator intensity (right-axis). Because the responsivity of the reference diode extends significantly beyond the response of the OPV cell, the extra NIR light from the solar simulator (compared to the AM1.5G spectrum) results in solar mismatch factors less than 1. FIG. 3(d) shows the measured (left axis, circles) and calculated (left axis, solid line) reflectivity of the distributed Bragg reflector used in this study as the transparent, NIR mirror. Also shown is the transmission spectrum (right-axis) of the broad-band antireflection (BBAR) coatings.

Figure 4:
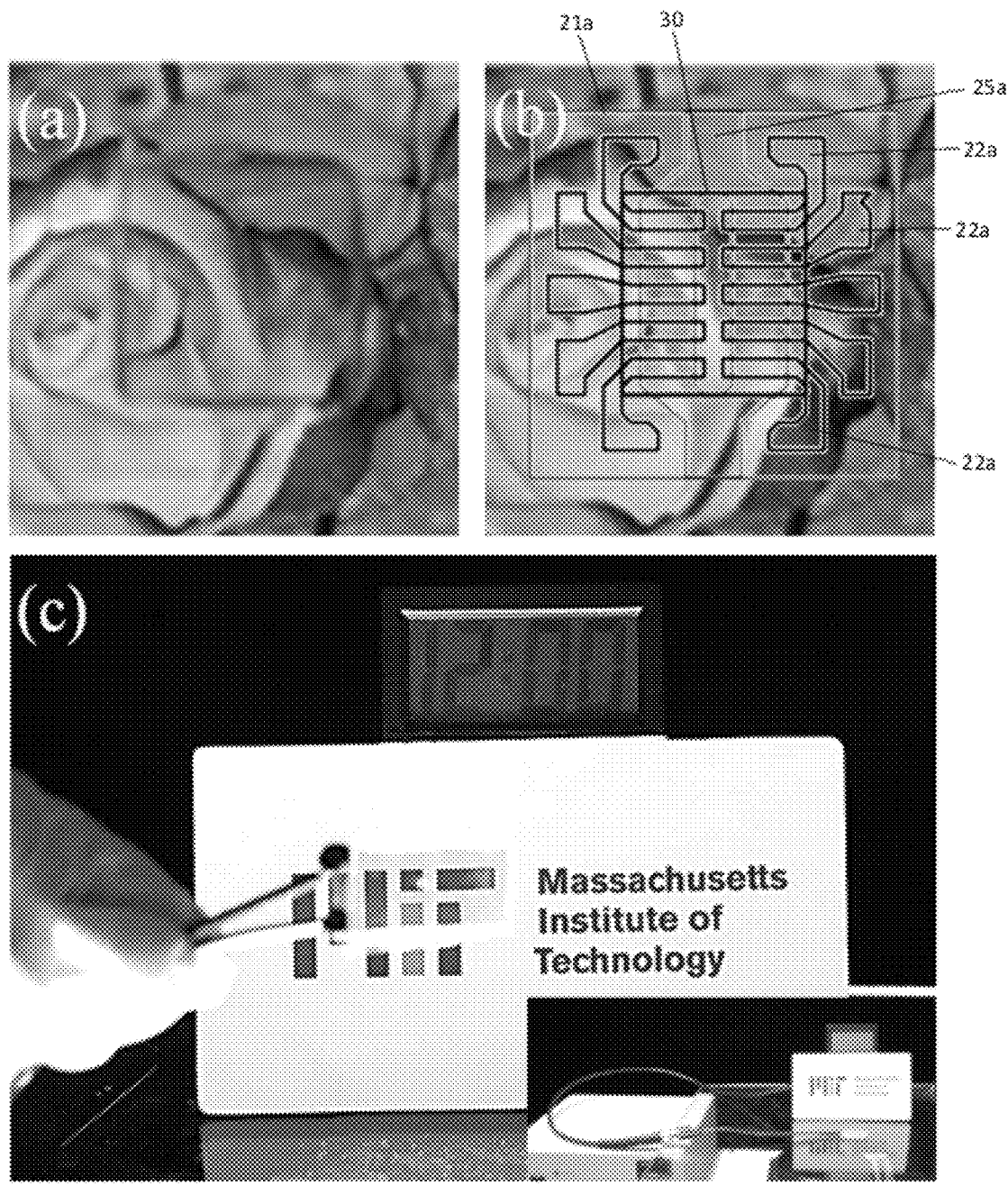
FIGS. 4a and 4b show solar cell arrays positioned in front of a picture of a "rose" to highlight the transparency of the fully assembled device.
FIG. 4c shows a solar cell array coupled to an LCD clock.
FIGS. 4d and 4e show an alternate embodiment of a solar cell array positioned in front of a picture of a "mountain" to highlight the transparency of the fully assembled device.
FIG. 4(f) is a picture of a full circuit assembly with connections to an LCD clock.
Figure 4:
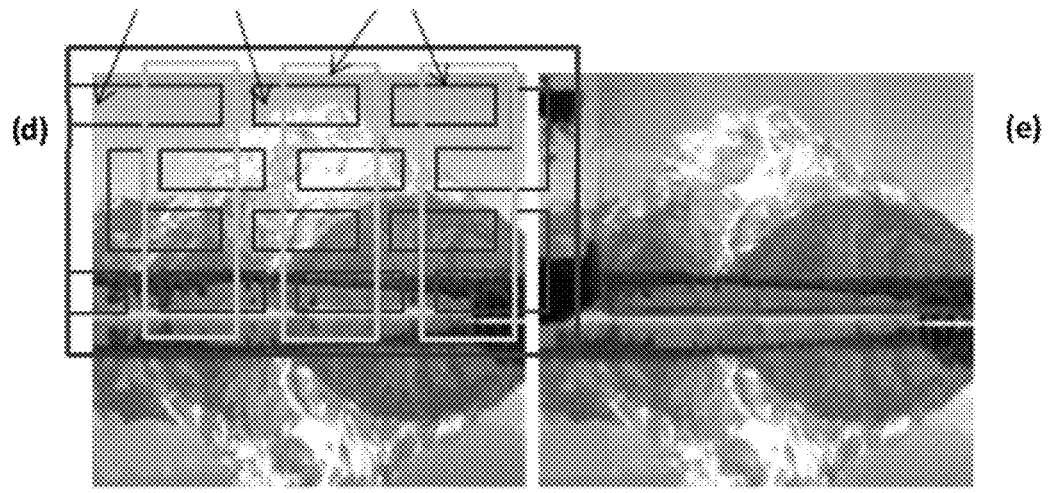
Figure 4:
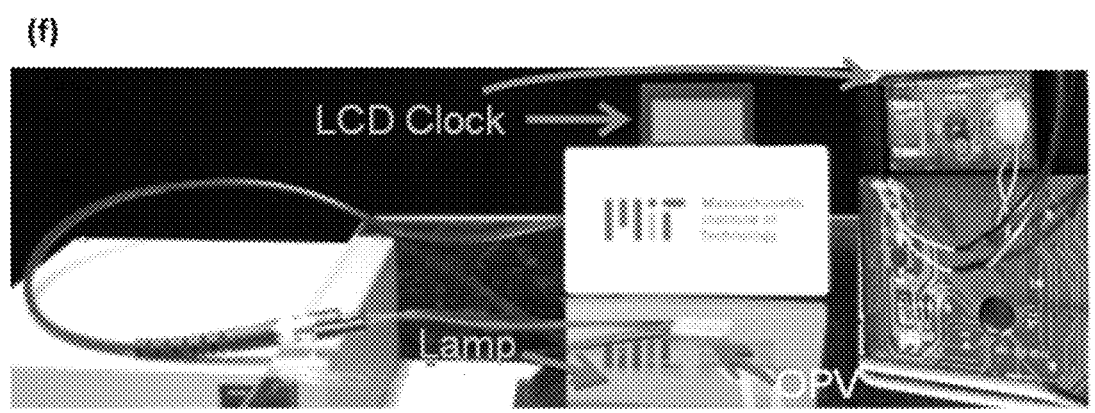

To highlight the transparency of the fully assembled device, FIGS. 4a and 4b show solar cell arrays in front of a picture of a "rose". Both picture-detail and color-clarity are minimally disrupted so that details of the device array pattern are even difficult to discern. In this example the array has a common cathode 25a and a plurality of anodes 22a. The device also includes an active area 30 which includes the donor layer(s), acceptor layer(s) and reflective mirrors. In this particular example, an array of 10 individual OPV devices is formed on the substrate 21a. FIG. 4(c) shows the array wired to power an LCD clock. FIGS. 4(d) and 4(e) show an alternate embodiment of a solar cell array positioned in front of a picture of a "mountain" to highlight the transparency of the fully assembled device.

FIG. 4(f) is a picture of a full circuit assembly (left). Electrical connections are made to the ITO contacts of the OPV device (array) via carbon-tape. The LCD clock is connected to circuitry (right) that limits the voltage and passes excess current to a small LED such that the clock works under a wide range of OPV illumination conditions. The LCD clock requires approximately 1.5V and 10 µA and can be run by the solar cell for intensities ≥0.05 suns (note that under the ambient lighting <0.01 sun, the clock is off).

Optimizing the transparent OPV structure with just the cathode thickness, power conversion efficiency of 1.0±0.1% is obtained, with a simultaneous average transmission of 66±3%. Incorporation of the NIR reflector and BBAR coatings with the optimized ITO thickness (see FIG. 2(a)) improves the power conversion efficiency to 1.4±0.1% with an average transmission of 56±2%. With the NIR mirror, the increase in power conversion efficiency stems from additional NIR photocurrent in the ClAlPc layer where the EQE shows a near doubling of the peak ClAlPc EQE from 10% to 18% (see FIG. 3(a)). The optimized power efficiency is nearly triple that of an existing visible-absorbing, semi-transparent, copper phthalocyanine planar device while also exhibiting 30% more average transmission, but is slightly less efficient (0.75×) than semi-transparent bulk-heterojunction structures that gain efficiency from active layer absorption in the visible and subsequently have nearly half the transmission.

Switching from planar to bulk-heterojunctions in these structures, efficiencies of 2-3% may be possible for this material set with nearly identical visible transmission, and is currently under investigation. Tandem stacking of subcells with active layer absorption deeper into the infrared could also enhance these efficiencies; combined with more sophisticated NIR mirrors, efficiencies beyond several percent and average visible transmission >70% are possible.

Figure 5A:
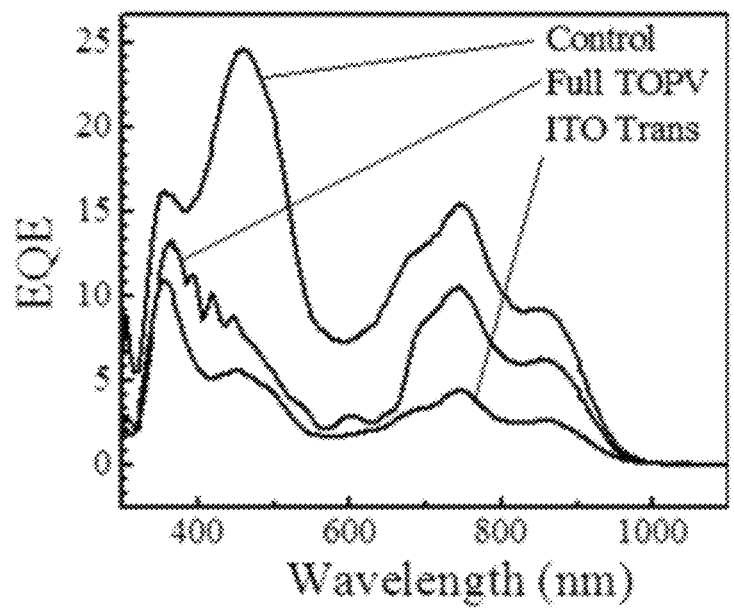
FIG. 5(a) is a graph showing external quantum efficiency (EQE) as a function of wavelength for a SnPc device.
Figure 5B:
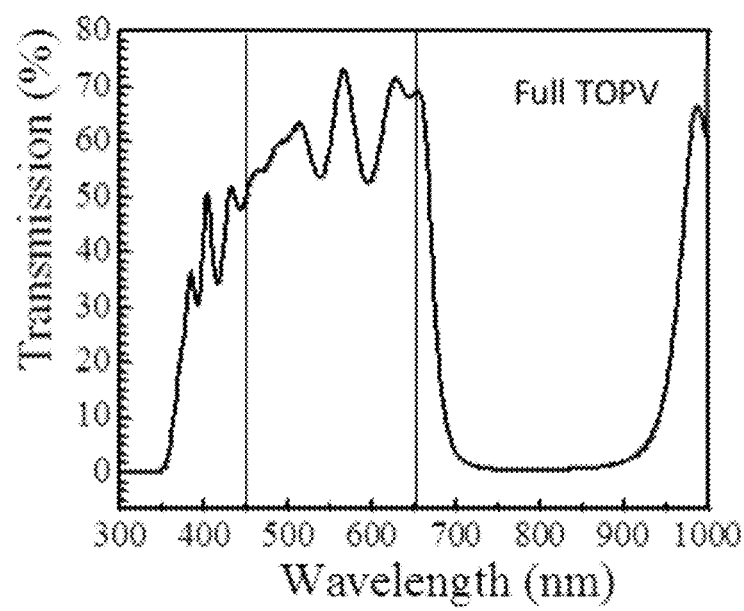
FIG. 5(b) is a graph showing transmission % as a function of wavelength for a SnPc device.

In another embodiment, SnPc, e.g., SnPc-$C_{60}$, may be used to construct transparent solar cells. Solar cell designs based on SnPc may achieve >2% efficient solar cell with >70% transmission of visible light (~70% average transmission across visible spectrum). The following layers were used in this example: ITO/SnPc(10 nm)/C60(30 nm)/BCP (10 nm)/ITO(10 nm)/DBR. In this example, the ITO was sputtered directly. The distributed Bragg reflectors (DBR) were applied with index matching fluid (IMF). FIG. 5(a) is a graph showing the EQE as a function of wavelength for the SnPc device. FIG. 5(b) is a graph showing transmissivity as a function of wavelength for the full TOPV SnPc device. A summary of various device performances is provided in Table 2:

TABLE 2

| Cathode | Jsc | Voc | FF | η (%) |
| --- | --- | --- | --- | --- |
| Ag | 6.15 | 0.40 | 0.55 | 1.3 |
| ITO | 1.54 | 0.33 | 0.48 | 0.2 |
| ITO-DBR | 2.25 | 0.34 | 0.44 | 0.3 |

The device may include a NIR mirror (transparent to visible light) composed of either metal/oxide (e.g. $TiO_2$/Ag/$TiO_2$) or dielectric stacks (DBRs e.g. consisting of $SiO_2$/$TiO_2$). Anti-reflection coatings may be composed of single or multilayer dielectric materials. As noted above, the molecular active layer may also be composed of any suitable phthalocyanine, porphyrin, naphthalocyanine dye, carbon nanotube, or molecular excitonic materials with absorption peaks outside of the visible spectrum.

Figure 6A:
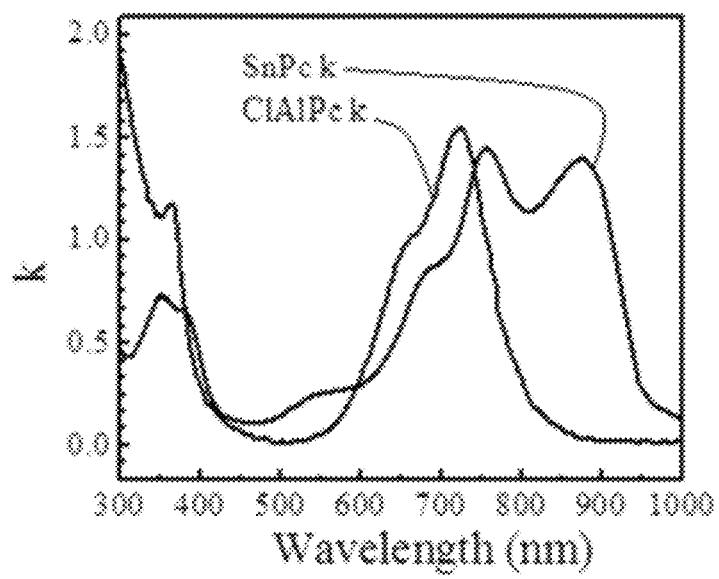
FIG. 6(a) is a graph showing a comparison between SnPc and ClAlPc designs.

FIG. 6(a) is a graph showing a comparison between SnPc and ClAlPc reference (opaque) designs. A summary of various device performances is provided in Table 3:

TABLE 3

| Donor | Thick | Jsc | Voc | FF | η (%) |
| --- | --- | --- | --- | --- | --- |
| SnPc | 100 | 6.15 | 0.40 | 0.50 | 1.2 |
| ClAlPc | 200 | 4.70 | 0.77 | 0.55 | 2.0 |

Figure 6B:
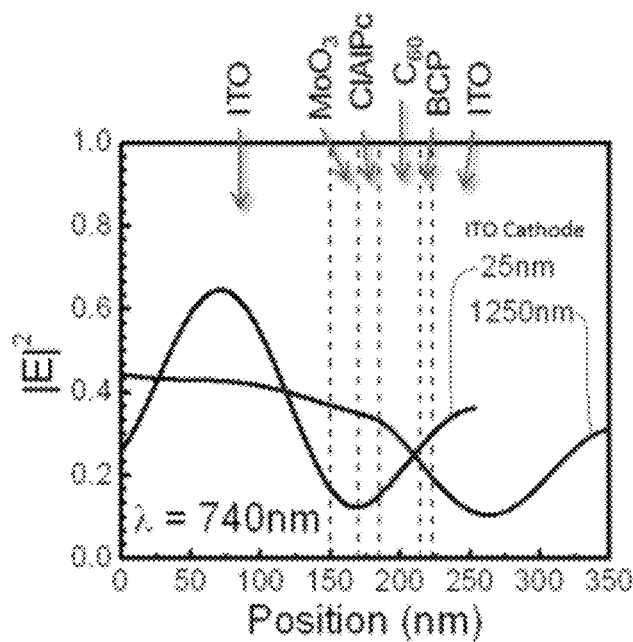
FIG. 6(b) is a graph showing the effect of ITO cathode thickness.
Figure 6:
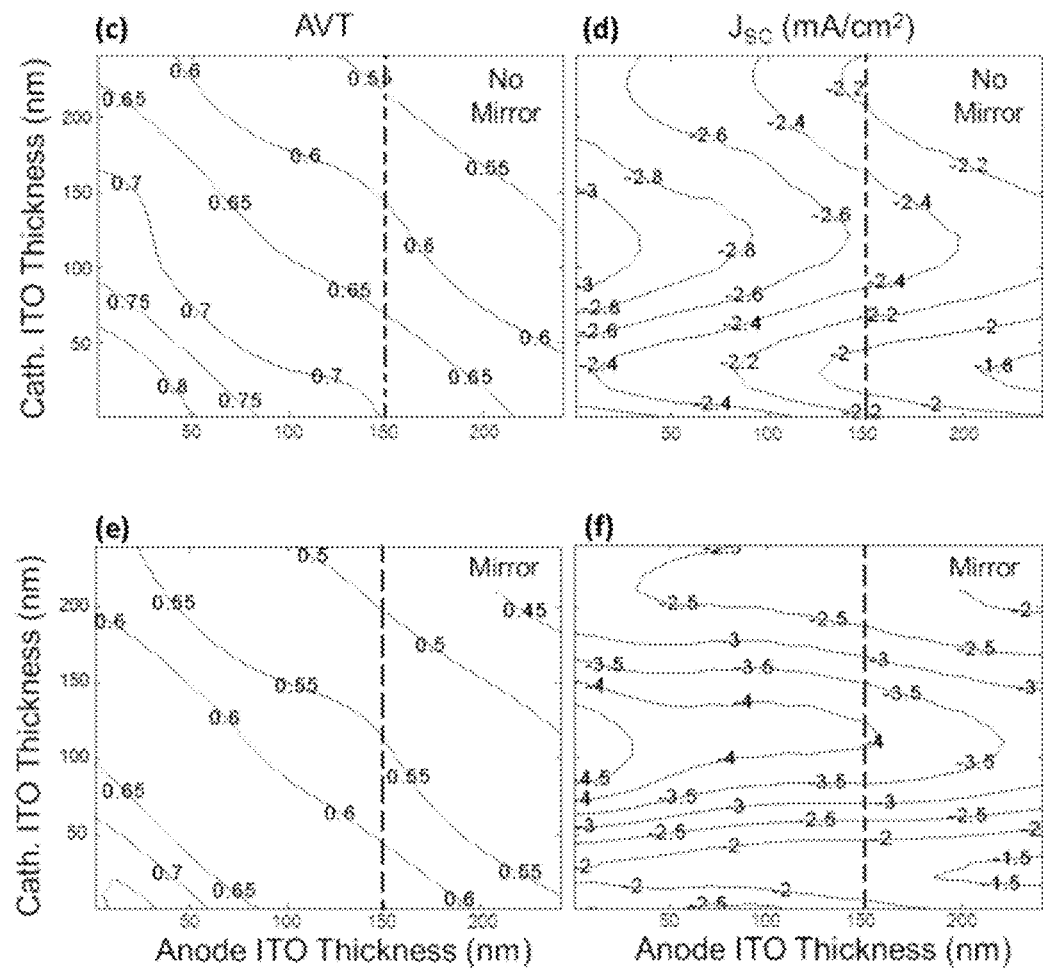
FIGS. 6(c) and 6(d) show the transfer matrix simulations of the average visible transmission (AVT, left column) and short-circuit current (right column) of the transparent OPV architecture as a function of the anode and cathode ITO thicknesses without a NIR mirror.
FIGS. 6(e) and 6(f) show the transfer matrix simulations of the average visible transmission (AVT, left column) and short-circuit current (right column) of the transparent OPV architecture as a function of the anode and cathode ITO thicknesses with a NIR mirror.

FIG. 6(b) is a graph showing the electric field and the effect of ITO cathode thickness. Calculated optical field, $|E|^2$, of the transparent OVP as a function of position at a fixed wavelength close to the peak absorption of the ClAlPc active layer (~740 nm) for an ITO cathode thickness of 20 nm (black line) and 120 nm (red line). Note the enhancement of the field within the ClAlPc layer for the optimized ITO thickness, where the absorption is proportional to $|E|^2$ integrated over position. In general, there is a strong dependence on ITO thickness.

FIGS. 6(c) and 6(d) show the transfer matrix simulations of the average visible transmission (AVT, left column) and short-circuit current (right column) of the transparent OPV architecture as a function of the anode and cathode ITO thicknesses without a NIR mirror. FIGS. 6(e) and 6(f) show the transfer matrix simulations of the average visible transmission (AVT, left column) and short-circuit current (right column) of the transparent OPV architecture as a function of the anode and cathode ITO thicknesses with a NIR mirror. The vertical dashed line indicates the thickness of the ITO anode utilized in this study. The active layer structure was Anode/MoO$_3$(20 nm)/ClAlPc(15 nm)/C$_{60}$(30 nm)/BCP(7.5 nm)/Cathode where the exciton diffusion lengths of ClAlPc and C$_{60}$ were estimated from fitting the magnitudes of the photocurrent and EQE of the control cell to be 8±4 nm and 15±6 nm, respectively.

Figure 7:
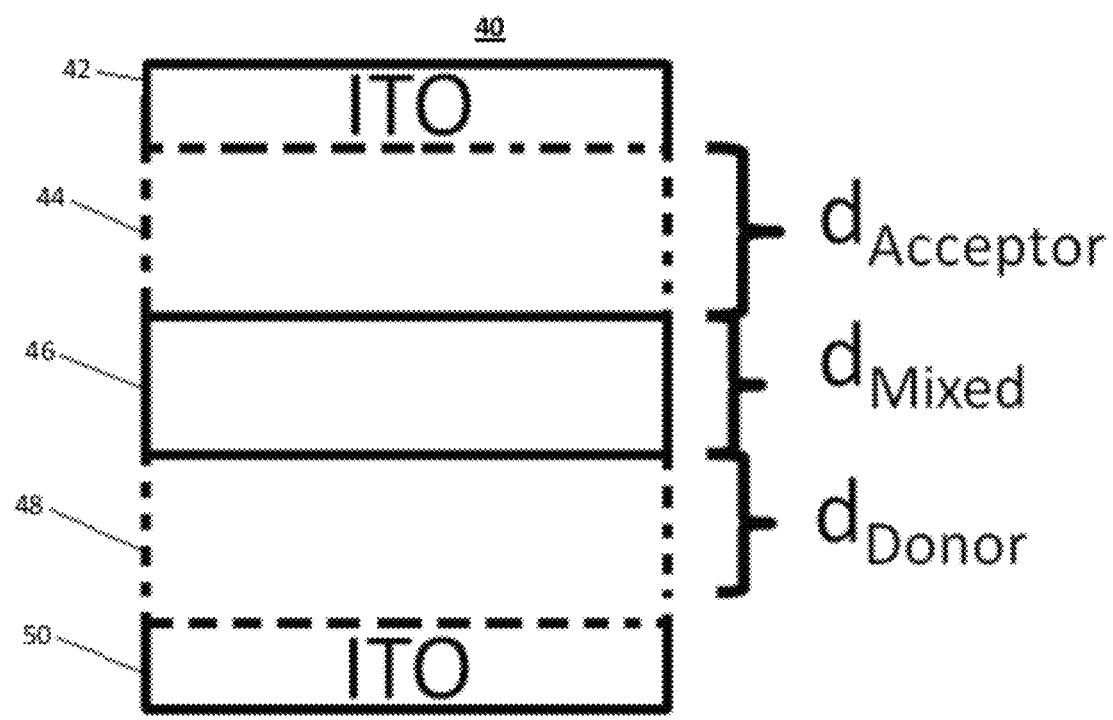
FIG. 7 is a block diagram of a device with a mixed layer including both a donor and an acceptor.

The structure shown in FIG. 1(b) includes discrete layers for the donor, e.g., ClAlPc or SnPc, and the acceptor, e.g., C$ho$. It should be understood that the donor and acceptor may be combined in a single or mixed layer as shown generally in FIG. 7. In this embodiment the device 40 may have a mixed layer 46 including both a donor and an acceptor. The mixed layer generally has a thickness d$_{mixed}$ as shown. The device 40 may optionally include a discrete donor layer 48 and/or acceptor layer 46. The donor layer 48, if present, has a thickness d$_{Donor}$ as shown. The acceptor 46 layer, if present, has a thickness d$_{Acceptor}$ as shown. It should be understood that FIG. 7 is simplified for matters of clarity and may include additional layers that are not shown. In this example, the device 40 also includes a transparent cathode 42 and a transparent anode 50. The thicknesses of each layer may be selected as generally outlined above. It should be understood that such a structure may also include other layers including anti-reflective layers and mirror layers as disclosed in the various embodiments herein.

An optimization process may generally be performed as follows:
i) Optimize for d$_{Donor}$, d$_{Acceptor}$ (total);
ii) Fix d$_{Donor}$, d$_{Acceptor}$ (total);
iii) Vary d$_{mixed}$;
iv) d$_{Donor}$=d$_{Donor}$ (total)−(d$_{mixed}$/2);
v) d$_{Acceptor}$=d$_{Acceptor}$ (total)−(d$_{mixed}$/2); and
vi) Optimize for ratio (d$_{Donor}$:d$_{Acceptor}$).

For devices having a mixed layer only, optimization may include an adjustment of the thickness of the mixed layer (step iii) and an adjustment of the ratio d$_{Donor}$:d$_{Acceptor}$ (step vi).

Figure 8:
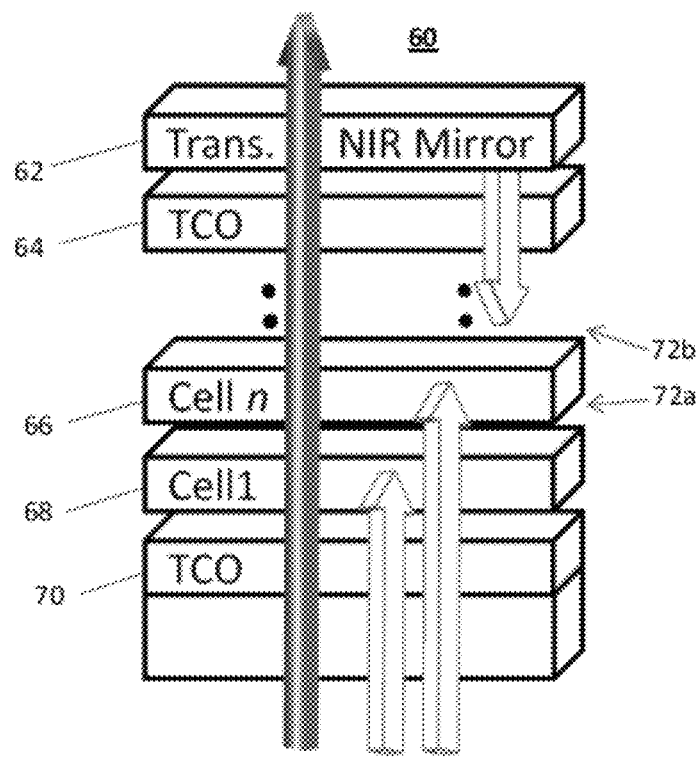
FIG. 8 is a block diagram of a tandem device.
Figure 9:
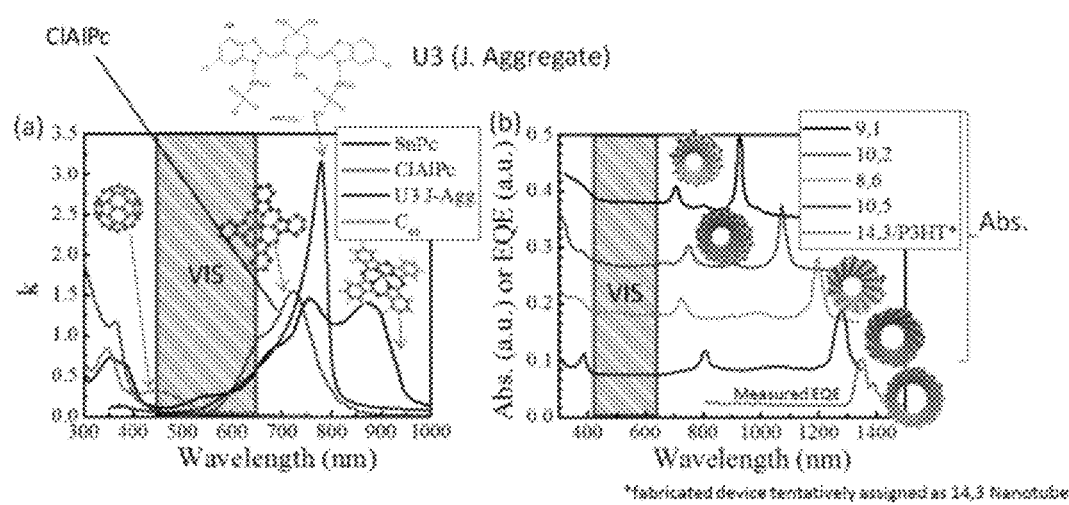
FIGS. 9(a) and 9(b) are graphs showing different bandgaps that may be used to optimize a tandem device.

FIG. 8 is a block diagram of a tandem device 60. The device 60 generally includes at least a first and second cell 66, 68. Each cell may have the structure generally disclosed above. Each of the first and second cells 66, 68 function has transparent subcells. Each may have a varying NIR spectral responsivity. Each of the first and second cells may have absorption peaks at wavelengths outside of the visible light spectrum. A recombination zone 72a is disposed between the first and second cells 66, 68. The recombination zone may be composed of a variety of compounds including, e.g., ITO(0.5-10 nm), or BCP/Ag(0.1-2 nm)/MoOx. Additional recombination zones are disposed between subsequent pairs of subcells as generally shown by reference number 72b. It should be understood that FIG. 8 is simplified for matters of clarity and may include additional layers that are not shown. In this example, the device 60 also includes a cathode 62 and an anode 70. The device may optionally include a transparent NIR mirror 62. FIGS. 9(a) and 9(b) are graphs showing different bandgaps associated with materials that may be used to optimize a device, e.g., US J. Aggregate (FIG. 9(a)) and carbon nanotubes (FIG. 9(b)).

It should be understood that multiple bandgaps may be selected for successive layers stacked in a tandem device in order to yield a device with the desired efficiency. In such devices, overall transparency is improved over devices that are independently fabricated and post integrated or macroscopically combined. This is possible because such a device benefits from a closely matched index of refraction at each interface between successive layers. The stacked structure may be transparent or semi-transparent.

Figure 10:
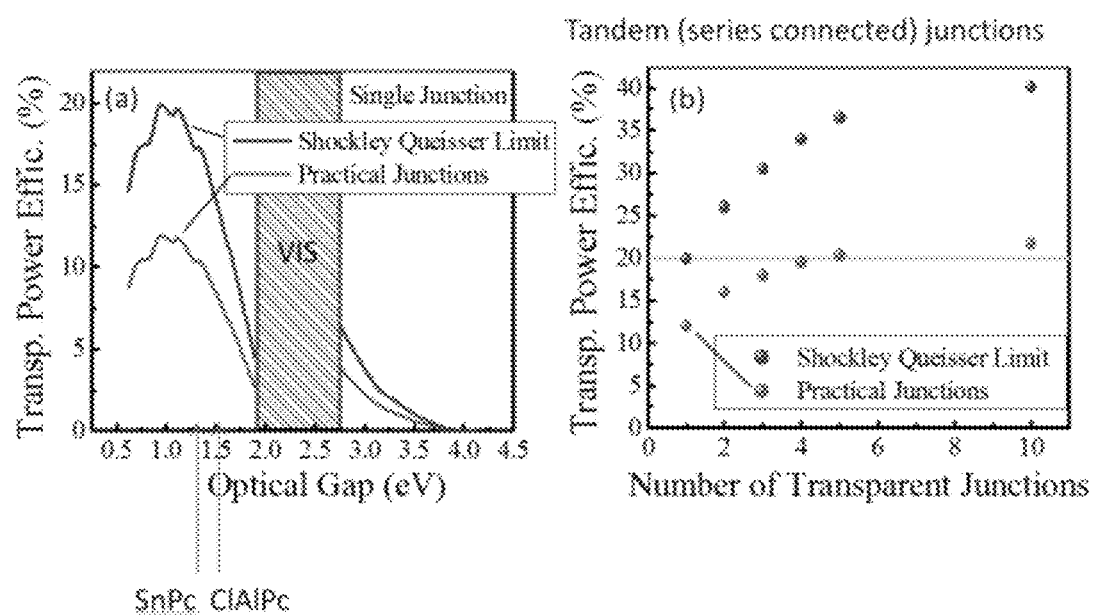
FIGS. 10(a) and 10(b) are graphs showing practical efficiency limits of several of the embodiments disclosed herein.
Figure 11:
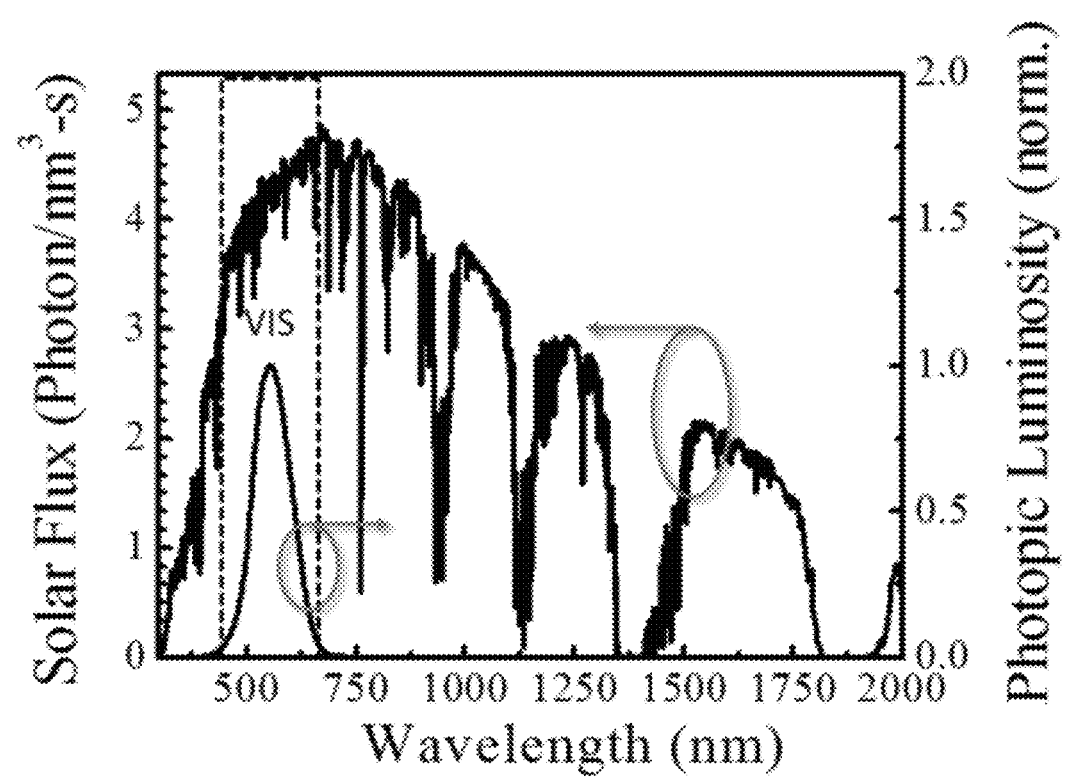
FIG. 11 is a diagram showing the solar flux and the photopic response of the human eye.

FIGS. 10(a) and 10(b) are graphs showing practical efficiency limits of several of the embodiments disclosed herein. FIG. 11 is a diagram showing solar flux and the photopic response of the human eye. In general, the photopic response of the human eye peaks in the green spectrum 530-500 nm and tapers off below 450 nm and above 650 nm.

Figure 12:
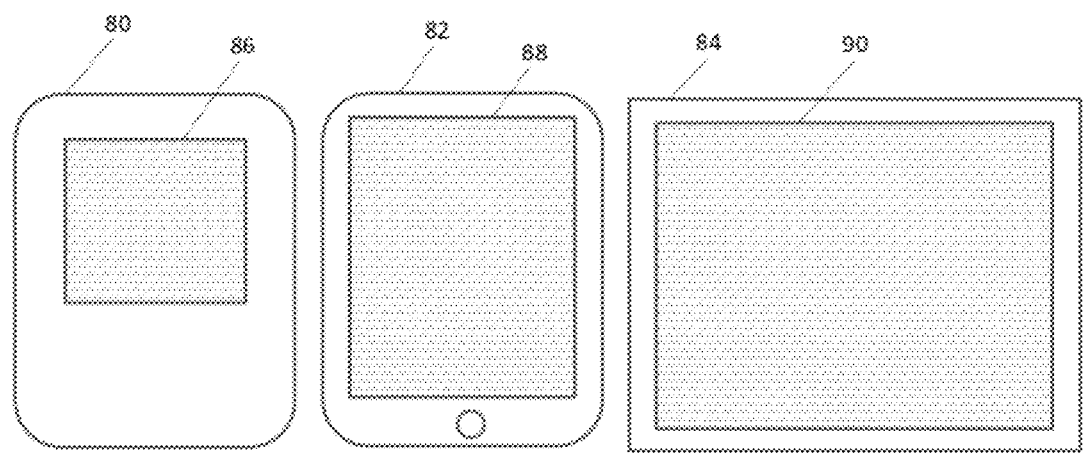
FIG. 12 is a diagram showing an e-reader, smart phone and display screen including a photovoltaic array as disclosed herein.

FIG. 12 is a diagram showing an e-reader 80, smart phone 82 and display screen 84 including photovoltaic arrays 86, 88 and 90 disposed on their respective display screens. It should be understood that a variety of devices may incorporate the photovoltaic devices disclosed herein and/or arrays of such devices. Other applications include watch crystals, automotive and architectural glass including sunroofs and privacy glass. The photovoltaic devices may be used for active power generation, e.g., for completely self-powered applications and battery charging (or battery life extension).

In conclusion, near-infrared absorbing, transparent planar organic solar cells with a maximum power of 1.4±0.1% and average visible transmission of exceeding 55±2% have been demonstrated. This average visible transmission is sufficiently transparent for incorporation on architectural glass. The excitonic character of organic semiconductors is advantageously exploited to produce unique photovoltaic architectures not easily accessible via inorganic semiconductors. By positioning the active layer absorption selectively in the NIR, it is possible to optimize the architecture using a NIR reflector composed of a DBR mirror centered at 800 nm that results in a transparent solar cell efficiency approaching that of the non-transparent control cell. Ultimately these devices provide a guide for achieving high efficiency and high transparency solar cells that can be utilized in windows to generate power, reduce cooling costs, and scavenge energy in a variety of applications.

What is claimed is:
1. A transparent photovoltaic cell, comprising:
a transparent substrate;
a first transparent active material overlying the transparent substrate, the first transparent active material having an absorption peak at a wavelength greater than about 650 nanometers, the first transparent active material's absorption peak being greater than the first transparent active material's absorption at any wavelength between about 450 and 650 nanometers;
a second transparent active material overlying the transparent substrate, the second transparent active material having an absorption peak at a wavelength between 300 and 450 nanometers or between 650 and 2500 nanometers, the second transparent active material's absorption peak being greater than the second transparent active material's absorption at any wavelength between about 450 and 650 nanometers;
a transparent cathode; and
a transparent anode;
the transparent photovoltaic cell having at least one absorption peak at a wavelength greater than about 650 nanometers that is greater than the transparent photovoltaic cell's absorption at any wavelength between about 450 and 650 nanometers, wherein the transparent photovoltaic cell is operable to transmit visible light with wavelengths between 450 and 650 nanometers.
2. The transparent photovoltaic cell of claim 1 wherein at least one of the transparent cathode and the transparent anode is configured to maximize absorption in the first transparent active material.

3. The transparent photovoltaic cell of claim 1 wherein at least one of the transparent cathode and the transparent anode is configured to maximize absorption in the second transparent active material.

4. The transparent photovoltaic cell of claim 1 wherein the first transparent active material and the second transparent active material are located in separate layers.

5. The transparent photovoltaic cell of claim 1, wherein the first transparent active material has a second absorption peak at a wavelength less than about 450 nanometers.

6. The transparent photovoltaic cell of claim 1, wherein the first transparent active material is a donor and the second transparent active material is an acceptor.

7. The transparent photovoltaic cell of claim 1, further comprising a visibly transparent reflector reflecting at near infra-red wavelengths.

8. The transparent photovoltaic cell of claim 1, wherein the first transparent active material comprises an organic material.

9. The transparent photovoltaic cell of claim 1, wherein the first transparent active material comprises at least one of: a phthalocyanine, a porphyrin, a naphthalocyanine dye or nanotubes.

10. The transparent photovoltaic cell of claim 1, wherein the first transparent active material comprises chloroaluminum phthalocyanine.

11. The transparent photovoltaic cell of claim 1, wherein the first transparent active material comprises tin phthalocyanine.

12. The transparent photovoltaic cell of claim 1, wherein the second transparent active material comprises at least one of carbon 60 (C60) or a nanotube.

13. The transparent photovoltaic cell of claim 1, wherein the first and second transparent active materials are configured for use with flexible encapsulation layers.

14. The transparent photovoltaic cell of claim 1, wherein the transparent photovoltaic cell is incorporated into one of a display screen, a watch crystal, automotive glass or architectural glass.

15. A transparent photovoltaic array comprising a plurality of electrically interconnected transparent photovoltaic cells according to claim 1.

16. The transparent photovoltaic cell of claim 1, wherein the transparent substrate is flexible.

17. A transparent photovoltaic cell, comprising:
a transparent substrate;
a first transparent active material overlying the transparent substrate, the first transparent active material having an absorption peak at a wavelength between 300 and 450 nanometers or between 650 and 2500 nanometers, the first transparent active material's absorption peak being greater than the first transparent active material's absorption at any wavelength between about 450 and 650 nanometers;
a second transparent active material overlying the transparent substrate, the second transparent active material having an absorption peak at a wavelength greater than about 650 nanometers or less than about 450 nanometers, the second transparent active material's absorption peak being greater than the second transparent active material's absorption at any wavelength between about 450 and 650 nanometers; and
a transparent cathode and a transparent anode;
the transparent photovoltaic cell having at least one absorption peak at a wavelength greater than about 650 nanometers that is greater than the transparent photovoltaic cell's absorption at any wavelength between about 450 and 650 nanometers, wherein the transparent photovoltaic cell is operable to transmit visible light with wavelengths between 450 and 650 nanometers.

18. A method of generating electricity, the method comprising:
providing a transparent photovoltaic cell comprising:
a transparent substrate;
a first transparent active material overlying the transparent substrate, the first transparent active material having an absorption peak at a wavelength greater than about 650 nanometers, the first transparent active material's absorption peak being greater than the first transparent active material's absorption at any wavelength between about 450 and 650 nanometers;
a second transparent active material overlying the transparent substrate, the second transparent active material having an absorption peak at a wavelength between 300 and 450 nanometers or between 650 and 2500 nanometers, the second transparent active material's absorption peak being greater than the second transparent active material's absorption at any wavelength between about 450 and 650 nanometers; and
a transparent cathode and a transparent anode;
the transparent photovoltaic cell having at least one absorption peak at a wavelength greater than about 650 nanometers that is greater than the transparent photovoltaic cell's absorption at any wavelength between about 450 and 650 nanometers, wherein the transparent photovoltaic cell is operable to transmit visible light with wavelengths between 450 and 650 nanometers; and
exposing the transparent photovoltaic cell to a light source.

19. The method of claim 18, further comprising providing a multi-layer reflector for reflecting near-infrared light.

20. The transparent photovoltaic cell of claim 7, wherein the visibly transparent reflector is a multi-layer distributed Bragg reflector (DBR).

21. The transparent photovoltaic cell of claim 1 wherein the transparent anode comprises a transparent conducting oxide.

22. The transparent photovoltaic cell of claim 1 wherein the transparent cathode comprises a transparent conducting oxide.

23. The method of claim 19 wherein the multi-layer reflector comprises a multi-layer distributed Bragg reflector (DBR).

24. The method of claim 18 wherein the first transparent active material and the second transparent active material are located in separate layers.

25. The method of claim 18 wherein the first transparent active material has a second absorption peak at a wavelength less than about 450 nanometers.

26. The method of claim 18 wherein the first transparent active material is a donor and the second transparent active material is an acceptor.

27. The method of claim 18 wherein the first transparent active material comprises an organic material.

28. The method of claim 18 wherein the first transparent active material comprises at least one of: a phthalocyanine, a porphyrin, a naphthalocyanine dye or nanotubes.

29. The method of claim 18 wherein the first transparent active material comprises chloroaluminum phthalocyanine.

30. The method of claim 18 wherein the first transparent active material comprises tin phthalocyanine.

31. The method of claim 18 wherein the second transparent active material comprises at least one of carbon 60 (C60) or a nanotube.

32. The method of claim 18 wherein the transparent substrate is flexible.

* * * * *